(12) United States Patent
Breil et al.

(10) Patent No.: US 9,431,534 B2
(45) Date of Patent: Aug. 30, 2016

(54) ASYMMETRIC FIELD EFFECT TRANSISTOR CAP LAYER

(71) Applicant: GLOBALFOUNDRIES INC., Grand Cayman (KY)

(72) Inventors: Nicolas L. Breil, Wappingers Falls, NY (US); Oleg Gluschenkov, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/557,541

(22) Filed: Dec. 2, 2014

(65) Prior Publication Data

US 2016/0155845 A1 Jun. 2, 2016

(51) Int. Cl.

| H01L 29/66 | (2006.01) |
|---|---|
| H01L 29/78 | (2006.01) |
| H01L 21/265 | (2006.01) |
| H01L 21/3115 | (2006.01) |
| H01L 21/311 | (2006.01) |
| H01L 21/02 | (2006.01) |
| H01L 29/06 | (2006.01) |
| H01L 21/84 | (2006.01) |

(52) U.S. Cl.
CPC ..... *H01L 29/7843* (2013.01); *H01L 21/02529* (2013.01); *H01L 21/02532* (2013.01); *H01L 21/26586* (2013.01); *H01L 21/31111* (2013.01); *H01L 21/31155* (2013.01); *H01L 21/845* (2013.01); *H01L 29/0642* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 7,872,303 | B2 | 1/2011 | Chan et al. |
|---|---|---|---|
| 8,263,451 | B2 | 9/2012 | Su et al. |
| 2009/0026505 | A1* | 1/2009 | Okano ............... H01L 29/66795 257/255 |
| 2013/0001705 | A1 | 1/2013 | Su et al. |
| 2013/0069171 | A1 | 3/2013 | Cheng et al. |
| 2013/0193446 | A1 | 8/2013 | Chao et al. |
| 2013/0228862 | A1 | 9/2013 | Lee et al. |
| 2014/0273360 | A1* | 9/2014 | Cheng ................. H01L 29/7853 438/157 |

* cited by examiner

*Primary Examiner* — Sonya D McCall Shepard
(74) *Attorney, Agent, or Firm* — Scully, Scott, Murphy & Presser, P.C.

(57) ABSTRACT

A device includes a field effect transistor on an insulating film. A first fin extends vertically from a top side of a horizontal surface of a semiconductor substrate. An epitaxial cap rests on the first fin, with a left vertex on a left side of the epitaxial cap at a first horizontal distance from a reference line that vertically bisects the first fin, and a right vertex on the right side of the epitaxial cap at a second horizontal distance from the reference line, the first horizontal distance being at least twenty percent greater than the second horizontal distance; and a top vertex is at a third horizontal distance to the left of the reference line.

9 Claims, 5 Drawing Sheets

ASYMMETRIC FIELD EFFECT TRANSISTOR CAP LAYER

BACKGROUND

Field effect transistors (FETs) can have source and drain regions, and fins that connect source regions to drain regions, on a blanket insulator film. Epitaxial fin caps (stressors) may be deposited on the fins in order to modify gate switching performance. A portion of fins that connect source and drain regions may lie beneath a gate (channel regions) may be induced to undergo current flow by applying a voltage to the gate and to the source region of the finFET.

SUMMARY

Embodiments are directed toward a field effect transistor that includes an insulating film on a horizontal surface of a semiconductor substrate. The insulating film has a top side with a first slope substantially parallel to the horizontal surface. A first fin extends vertically from the insulating film and an epitaxial cap made of a first material rests on the first fin, the epitaxial cap having a left vertex on a left side of the epitaxial cap at a first horizontal distance from a vertical reference line that bisects the first fin; a right vertex on a right side of the epitaxial cap at a second horizontal distance from the reference line; and a top vertex a third horizontal distance to the left of the reference line; the first horizontal distance being at least twenty percent greater than the second horizontal distance.

Certain embodiments are directed toward a method of stressing fins of field effect transistors, the method comprising creating adjacent fins on an insulating film; creating a plurality of implanted regions in the insulating film by implanting ions at an implantation tilt angle greater than 1 degree into the insulating film; etching the insulating film to form a plurality of recessed regions, each having a graded recess profile that includes a deep side and a shallow side between the adjacent fins; and depositing a stressor on each of the adjacent fins; the stressor having a first side with a first thickness extending over a shallow side of a first recessed region of the plurality of recessed regions; and a second side with a second thickness extending over a deep side of a second recessed region of the plurality of recessed regions, the first side being at least twenty percent greater than the second thickness.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to field effect transistors (FETs), and more particular aspects relate to methods of applying and modulating strain in field effect transistors with raised channels or fins (finFETs). Other aspects of the present disclosure relate to methods of protecting insulating films that underlie FinFETs (sometimes known as silicon on insulator, or SOI, technology) during the process of manufacturing an integrated circuit. While the present disclosure is not necessarily limited to such applications, various aspects of the disclosure may be appreciated through a discussion of various examples in these contexts.

Field effect transistors (FETs) operate when a voltage is applied to a gate structure within the FET to trigger the flow of electrical current through a channel that lies between a source and a drain. In some FETs, the source and drain are embedded within a silicon layer in a semiconductor wafer that has been doped with implanted ions, the channel lies between the source and drain regions within the silicon layer, and the FET gate is built up to overlay the channel between the source and drain regions. In particular embodiments, spacer material may be deposited on the sides of the gate in order to provide a degree of control over the implanted ion distribution within the source and drain regions, and to insulate the channel and the gate from contacts that are formed on top of the source and drain.

Embodiments of a finFET may be constructed on top of a layer of insulating material (an insulating film) that acts as a non-conductive base layer through which current cannot flow while the finFET is idle. The source, drain, and fins may be three-dimensional structures that are formed from a single layer of silicon present atop the insulating film. The source and drain structures may lie on the insulating material and run parallel to each other while fin structures may extend perpendicular to the source and drain features and connect the source and drain features. A single finFET structure may have at least one fin running perpendicular to the source and drain structures. Some embodiments of finFETs may have three or more fins connecting source and drain, the fins being overlaid by a gate structure.

A finFET gate may activate the device by receiving an applied voltage and transferring that voltage along the gate to each of the finFET fins, causing current to flow from the source to the drain within the fin channels. Particular embodiments of finFETs may use conductive stressor structures, epitaxially deposited fin caps and claddings, to apply strain to the silicon fins in order to modify the finFET's electrical properties. In addition to applying strain, such conductive stressor structures aid in reducing electrical resistance within the source and drain structures by providing additional volume for the current to flow through. Other embodiments may also use a strain inducing layer deposited atop the stressor structures to further apply strain to the fins by straining the fins and stressor structures themselves. Such additional strain-inducing layer can be either insulating or conductive.

Stressors may apply compressive or tensile strain to finFET fins in order to modify gate switching properties. The sign and direction of the beneficial strain depends on the transistor polarity, channel material, and channel crystallographic orientation. For instance, a compressive strain along the fin channel increases hole mobility for a positive channel finFET (p-finFET) with silicon-based channel oriented along the [110] crystal direction according to the Miller indices notation for silicon-based crystals. Similarly, a compressive strain perpendicular to the fin channel increases electron mobility for a negative channel finFET (n-finFET) with silicon-based channel oriented along [110] crystallographic direction while a compressive strain along the fin channel decreases electron mobility for such transistor. Reversing strain sign from compressive to tensile reverses the effect onto respective mobility.

While increasing channel mobility can be viewed as a highly beneficial, there are complementary metal-oxide semiconductors (CMOS) circuits that may also benefit from reducing electron/hole mobility for certain transistors within. One example of such circuit is a six-transistor Static Random Access Memory (6T SRAM) cell that consists of 3 pairs of transistors referred to as pass, pull-down, and pull-up pairs. The pull-up transistors are generally positive channel field effect transistors (pFETs) and pull-down and pass transistors are negative channel field effect transistors (nFETs). Proper SRAM cell operation can be obtained using certain drive current ratios between the pairs. Generally, the pull-up pair has the smallest drive current, the pass pair has 50% to 150% larger drive current than the pull-up pair, and the pull-down pair has 50% to 150% larger drive current than the pass pair. While these current ratios are can be achieved through geometrical sizing of respective transistors, which may be done by varying the number of fins per transistor, the modulation of channel mobility can also be used to set the current ratios. Specifically, fixing pull-down transistor geometry to its minimal footprint (e.g. using one fin per transistor) and reducing channel mobility of other transistor pairs through the application of stressors results in a compact SRAM cell. Similarly, other logic circuits that require certain drive current ratios between their transistors may employ application of stressors to set such current ratios while improving circuit density. Accordingly, some embodiments include application of stressors to increase transistor channel mobility for faster transistor switching while other embodiments include application of stressors to decrease transistor channel mobility for denser integrated layouts.

Some stressors may be made of mixtures of silicon and germanium in order to induce compressive strain within the fins, with varying proportions of germanium in order to modulate the strain in the fin. The significance of using silicon-germanium (SiGe) stressors is that the lattice constant of bulk material in an equilibrium, unstrained state is larger than that of silicon. When a crystalline material with a larger equilibrium lattice constant is grown on a channel/fin made of a material with a smaller equilibrium lattice constant, it exerts a compressive strain onto fin/channel material. Conversely, when a crystalline material with a smaller equilibrium lattice constant is grown on the channel/fin material with a larger equilibrium lattice constant, it exerts a tensile strain onto fin/channel material. While in some embodiments, silicon fins/channels are compressively strained by SiGe stressors, in other embodiments, the SiGe fins/channels are compressively strained by SiGe stressors with higher germanium content. Meta-stable alloys of silicon and carbon (Si:C) have an unstrained lattice constant smaller than that of silicon crystal and hence can be employed as tensile stressors. Alternative channel/fin materials such as compound semiconductors from group III and group V elements from the periodic table can also be strained with crystalline epitaxial stressor that have different crystal lattice.

More particular embodiments of finFETs may further include cap and cladding layers atop and aside of the stressors that can influence the strain levels of the fins. Additionally, the cap layers may be made of metal silicides such as nickel silicides, cobalt silicides, titanium silicides or tantalum silicides. The cap layers may also include a layer of silicon without germanium, but including the dopants (doped silicon). Such a cap layer can be introduced to help the silicidation process. Stressors can also include silicon and carbon alloys that are useful to introduce a tensile stress.

In some embodiments, the strain-inducing effects of the stressor or cap layer may be modulated by adjusting the thickness of stressor on the finFET fin. Strain may be applied along an axis perpendicular or parallel to the conduction channel in different FET embodiments. In some embodiments of the present disclosure, shear and shear torsional strain may be applied to the finFET channel by forming an asymmetric stressor on finFET fins. Asymmetric stressors may be formed after asymmetrically recessing the insulating film on which the finFET is constructed. Asymmetrically recessing the insulator film to form a graded recess profile may alter the manner in which material is deposited or grown onto the finFET or the wafer surface during subsequent finFET processing steps.

One way of creating a graded recess profile in the region between finFET fins may be to implant ions using implantation tilt angles that are not perpendicular to the wafer surface. Common terminology refers to the angle between ion beam trajectory from the ion implantation source to the wafer surface normal as the implantation tilt angle. For ions approaching wafer surface on a perpendicular path, the implantation tilt angle is zero. If the wafer is slightly tilted, the implantation tilt angle is low. If the wafer is tilted to a greater degree, the implantation tilt angle is larger. In embodiments where the wafer is tilted, the amount of implantation in the region between the fins may vary from one side of the region (adjacent to one fin) to the other side (adjacent to the other fin). One of the fins, closer to the implantation source than the other, may provide a "shadow" that prevents or reduces the amount of implantation in the region of dielectric material that is hidden from the implantation source by the shadowing fin. In such embodiments, the implantation profile across the region between fins may have a "stepped" shape, deep at one side and shallow (or not implanted at all) near the shadowing fin. In other embodiments, the implantation profile may be graded or gradual, being shallow in the region adjacent to the shadowing fin and deeper near the other fin. In more particular embodiments, the choice of forming or not forming such graded implantation profile for a preselected collection of fins may be regulated by applying a mask of some kind (such as a photoresist or an antireflecting coating) to the region containing pre-selected fins prior to implantation. Material implanted by chemically neutral ions may be removed more quickly than unimplanted material, resulting in a stepped surface. An asymmetric stressor may be formed as the epitaxial growth of the stressor responds to the shape of the dielectric material adjoining the fin where the stressor is being grown.

According to embodiments, angled implantation may result in deeper/denser ion implantation on one side of the region between fins, and a shallower/less dense ion implantation on the other side of the region between fins. The depth to which a region may be recessed during a clean or etch step may relate to the extent of insulator film damage that has occurred as a result of ion implantation, where more implanted (more damaged) films may have weaker bonding between their constituents, resulting in an increased etch rate of the material relative to the recess rate experience by an undamaged part of the region. The implanted oxide insulating film may be removed by using an oxide etching solution showing a selectivity between the implanted and the non-implanted oxide areas, such as a fluoridric acid wet solution.

Embodiments of the present disclosure may also include asymmetric stressors to provide additional protection for the underlying insulating film during subsequent processing steps. Stressors may be grown using methodologies such as an epitaxial growth that, can deposit crystalline material selectively on particular substrates such as the exposed silicon of a finFET fin. Stressors grown in symmetric shapes on finFET fins may become sufficiently large that adjacent stressor structures may touch each other, forming a seam where they touch. The seam between stressors may be a source of failure during subsequent processing steps. Seams between stressors may susceptible to the chemistries of directional plasmas used to etch the wafer, leading to uneven punchthrough during etching, causing damage in and contamination of the underlying insulating material. Thermal cycling during and after the manufacturing process may lead to degraded finFET performance because of contamination of the insulating film.

Asymmetrically grown stressors may provide additional protection (relative to that afforded by symmetrically grown stressors) of the underlying insulating film in some embodiments of the present disclosure. Asymmetric stressors may overshadow or overlap each other, putting more stressor material above the insulator film to resist etch punchthrough in subsequent manufacturing steps. The interface between adjacent asymmetric stressors may still be present in some embodiments, but oriented at an angle away from perpendicular relative to the wafer surface. In other embodiments, asymmetric stressors may not touch each other (therefore having no interface), the space between stressors being filled by cladding or some other material at a later time in the manufacturing process.

Figure 1:
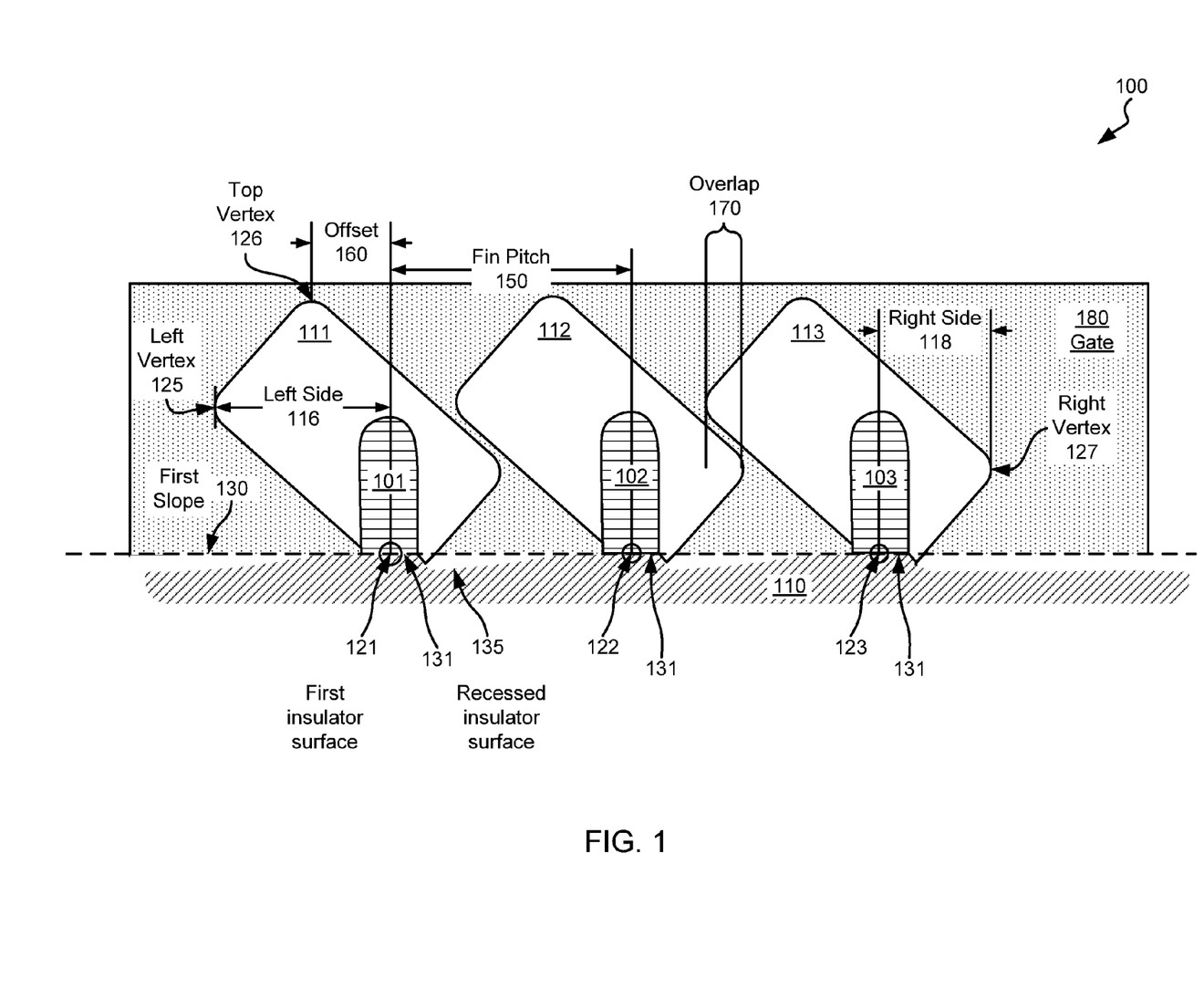
FIG. 1 depicts field effect transistor fins capped with epitaxially-grown segmented fin caps, according to embodiments of the present disclosure.

FIG. 1 shows a cross section 100 of a finFET structure where the fins capped with epitaxially-grown stressors in discrete segments, according to embodiments of the disclosure. A blanket insulator film 110 acts as the foundation for each of the fins in the finFET. A finFET may have multiple fins such as fins 101, 102 and 103, and each fin may have a separate stressor on top of it. A finFET gate 180 may overlay the fins adjacent to the stressor on each fin.

The insulator film 110 may have an interface 131 where fins lie on the insulator film. The horizontal interface 131 may have a horizontal plane 130 that corresponds to its top surface and that lies between the top surface and the bottom of finFET fins. The horizontal plane 130 can be used to characterize modifications to the region of the insulator film between adjacent fins 101 and 102, and adjacent fins 102 and 103 after subsequent processing may occur. In this embodiment, the recessed region 135 of the insulator film 110 may have a second slope that differs from the slope of the horizontal interface 131. From a second fin 102 to a first fin 101, the recessed region 135 may be recessed asymmetrically, where the left part of the recessed region (adjacent to fin 101) may be recessed further into the insulating film than the right part (adjacent to fin 102) of the recessed region 135. The graded recess profile may have a slope that runs below the horizontal plane 130 and slope downward from the second fin 102 toward the first fin 101 for most of the recessed region between the fins. The graded recess profile may also have a stepped surface (not shown) such that one side of the recess region is below the horizontal plane 130 and the other side of the recessed region is almost in line with the horizontal plane 130. The recessed region 135 may be created by implanting chemically neutral ions into the insulator film 110 and then etching the insulator film, such as with an acidic solution that dissolves some of the insulator film 110, and may preferentially dissolves portions of the insulator film 110 that have been implanted with chemically neutral ions. In some embodiments, the implantation of ions may be done with a tilted incident angle, where the ions do not approach the surface of the insulator film 110 at a direction perpendicular to the surface.

The asymmetry of the recessed area between fins 101 and 102 may cause the stressors on fins 101 and 102 to grow asymmetrically. This stressor asymmetry may be due to the epitaxial growth retardation in the recessed insulator area in the early phases of the growth on one side of the fin. It might be due as well to an interaction between the recessed insulator film and the growing epitaxial front. Accordingly, stressor 111 may grow more slowly outward near the deep side of the recessed area and stressor 112 may grow more quickly outward on the shallow side of the recessed area.

Adjacent fins in a finFET may be separated by distance called the fin pitch 150. The fin pitch 150 may be measured from between reference points such as reference points 121 and 122 on adjacent fins in the finFET. In some embodiments the reference points may be on the sides of fins, or they may be located at the topmost point of the fin. In other embodiments, the reference point may be located at the interface between the insulating film and the bottom edge of the film at a point equidistant between the two sides of the fin, such that a line extending upward from the reference point, perpendicular to the surface of the insulating film, bisects the semiconductor fin (leaving half of the fin on one side, and half the fin on the other side). Sometimes the semiconductor fin will have more material on one side, due to uneven etching during fin formation, but the reference point at the base may still be used to indicate an approximate bisection line through the fin.

Whatever the location of the reference point, the characteristics that are associated with its location may be present on each fin such that the reference point can be identified using those characteristics on each other fin. Accordingly, reference points with similar characteristics can be used as measurement points on fins. For example, the fin pitch may be determined by measuring between the "left" sides of adjacent fins or, alternatively, may be determined by measuring from the bisection lines of adjacent fins. Similarly, stressor asymmetry may be quantified by measuring the stressor relative to reference points on fins or to reference lines that extend upward from reference points that are at the middle of the fins. For example, the size of a left side 116 of stressor 111 may be measured between the reference line extending up from reference point 121 and the left vertex 125. The size of a right side of stressor 113 may be determined by measuring between the reference line extending up from reference line 123 and the right vertex 127. In some embodiments, the left side of an asymmetric stressor may be larger than the right side of the asymmetric stressor. While there may be some variation in the respective sizes of left and right sizes of symmetric stressors, asymmetric stressors may have left sides at least twenty percent thicker than their right sides.

In symmetric stressors, the size of the left side and the right side of a stressor can be nearly equal, and the top vertex can be nearly directly above the center of the fin. In embodiments of asymmetric stressors, however, the top vertex may be offset from the fin center. For example, the top vertex 126 of stressor 111 may be at an offset 160 from the center of fin 101. In some embodiments, the top vertex 126 may be directly above the insulator film 110 and not the fin 101.

In some embodiments, adjacent asymmetric stressors such as stressor 112 and stressor 113 may have an overlap 170 where the left vertex from one stressor extends past the right vertex of the other stressor, placing part of one stressor above the other. It is this "double coverage" of the insulator film 110 by two asymmetric stressors that can provide extra protection of the insulator film 110 during etch steps such as the formation of source contacts, drain contacts, and gate-switching contacts, that can involve directional plasma etching processes.

Figure 2:
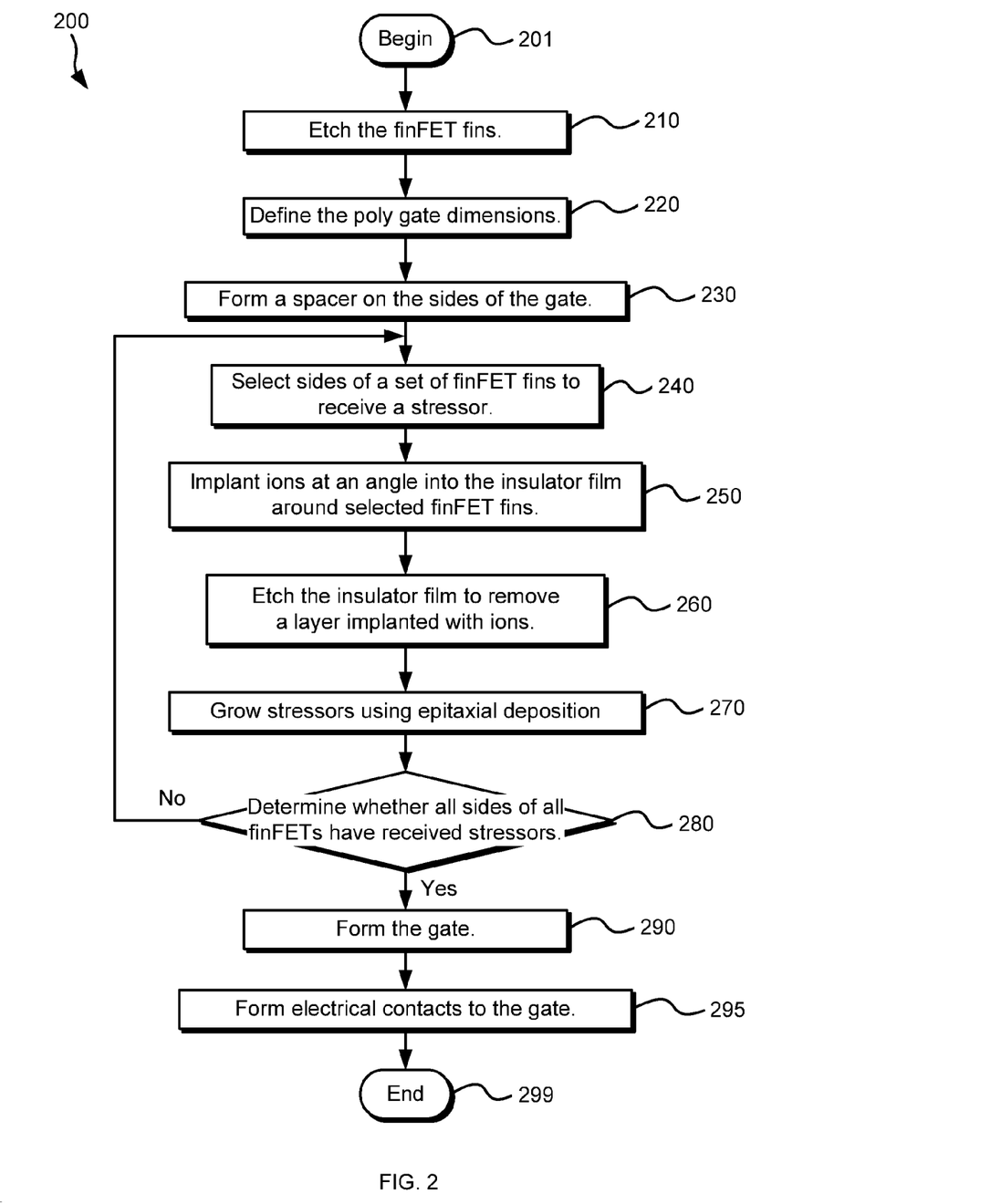
FIG. 2 describes steps in a method of forming asymmetric epitaxial fin caps according to aspects of the present disclosure.

FIG. 2 describes steps in a method 200 of forming asymmetric stressors on top of finFET fins according to aspects of the present disclosure. The method begins in block 201. As a first step, the finFET fins may be patterned and etched in order to provide physically narrow, high-surface area channels between the source and drain of a finFET, as described in block 210. The method may also include depositing, patterning and etching material in order to form a dummy gate on top of the silicon fins in the finFET, as described in block 220. Embodiments may also include depositing material on the finFET to form a spacer on the sides of the gate, as described in block 230.

The method may further contain a step where a manufacturer selects a set of finFET fins to receive stressors, and the manufacturer may further select whether to form stressors on the source side of the fin, the drain side of the fin, or both sides of the fin, as described in block 240. In some embodiments, negative channel field effect transistors (nFETs) may be processed in order to receive stressor fin caps at a different time than positive channel field effect transistors (pFETs). In other embodiments, both nFETs and pFETs may be processed simultaneously in order to receive their stressor caps, according to aspects of the present disclosure. In particular embodiments, the fins in a set of finFETs may be divided into "sides." A side may be delimited by the source and the gate, or by the drain and the gate, according to embodiments. Accordingly, in some embodiments, both sides of a set of finFET fins may receive their stressors at the same time and have their stressors tilt in the same direction. In such embodiments, the asymmetric stressors overlap each other and provide protection for the underlying layers. In other embodiments, both sides of the fins in the set of finFET fins may be processed to receive stressors, but at different times. Fins on one side of finFETs in the set may be processed to receive stressor fin caps that tilt in one direction, while fins on the other side of the finFETs in the set may be processed to receive stressor fin caps that tilt in the opposite direction. In such embodiments, the overlapping of the asymmetric stressors may perform the function of protecting the underlying layer as well as the function of applying strain to the finFET fins.

After selecting a set and sides of finFETs to receive stressors, the wafer may be prepared, such as by depositing films, patterning, and removing portions of the deposited films, in order to selectively implant ions at an implantation tilt angle of at least 3 degrees from the substrate normal and no more than 60 degrees from the substrate normal, inclusive, into regions of the insulator film adjacent to the selected fin sides, as described in block 250. The block 250 may include several angled implantation steps that may serve different objectives, more particular, there can be two objectives that may be accomplished at this step: creating asymmetric recess regions in the insulator film on which the finFET fins stand and enabling symmetric, uniform doping of exposed fins. These objectives may require different ion implantation processes. In some embodiments, for the purpose of creating asymmetric insulator recess regions, the ions can be beneficially selected from a set of chemically neutral ions that do not alter conductivity of fins and do not alter chemical structure of the implanted oxide. Some examples of such chemically neutral ions can include the ions of noble gases such Ne, Ar, and Xe. In other embodiments, the ions can be selected from a set of chemically active ions which may chemically alter insulator structure but remain neutral with respect to changing conductivity of fins. Examples of such chemically active ions may include C, N, and F ions. The energy of implanted ions can be selected to be low enough to prevent full amorphization of fins and may be between 300 eV (electron volts) and 4 keV (kiloelectron volts). In order to further suppress a full amorphization of fins, the implantation can be conducted at an elevated substrate temperature of from 50 degrees Celsius and 250 degrees Celsius. The implantation tilt angle may be adjusted in order to provide implantation in a certain fraction of the region between finFET fins in some embodiments. Low implantation tilt angles may be preferable for tall finFET fins or finFET fins that have a small pitch, while high tilt implantation angles may be better suited to finFETs with shorter fins or larger pitches.

The non-perpendicular ion implantation may serve to create asymmetric implantation regions in the insulator film on which the finFET fins stand. For various reasons that may include ion deflection caused by fin charging as well as shadowing of the insulator film by the fins for some non-perpendicular implantation angles, ions may implant more densely or more deeply on one side of the insulator film region between fins than on the other side of the implantation region.

The method may also include an etching step, where the implanted region of the insulator film between fins may be etched, such as by a plasma etch or a liquid-based etch process, as described in block 260. The implanted regions of the insulator film may etch more quickly than undamaged insulator film material because ion implantation may damage the insulator film's structure and bonding. The presence of chemically active ions in the insulator film may also promote chemical reactions during the etching step that enhance or retard the removal rate of implanted insulator film material relative to unimplanted insulator film material. Adding carbon or nitrogen ions to the insulator may result in retarding the rate of implanted insulator removal while adding fluorine may enhance the rate of removal. In some embodiments, etch conditions and exposure times may be such that the implanted/damaged insulator material (e.g. silicon dioxide) is completely removed and some undamaged insulator material is also removed.

Removal of the implanted material may produce a graded recess profile similar to the profile of implanted ions within the insulator film after the implantation step. The region near one fin may be deeply implanted, while the opposite side of the region may be shallowly implanted or not damaged at all. The middle part of the region may reflect the graded or stepped nature of the implant and the removal. In some embodiments, the depth of ion implantation and the shape of the removed region may be vary in a roughly linear fashion from near one fin to near the other fin. In other embodiments, some variation in the depth of implantation and removal across the middle of the intra-fin region may deviate from a smooth, linear profile, but still show an uneven or asymmetric profile.

Parts of the insulator film that have been implanted with ions may be removed more quickly than undisturbed insulator film, causing the profile of the removed material to mimic the implantation profile within the insulator film. According to embodiments, the bottom of the implanted region (and the recessed region) may have a slope deviating from the slope of the insulator film top surface by at least half a degree, and up to ten degrees.

The non-perpendicular ion implantation may also serve to dope exposed portions of selected fins. Contrary to the intentionally induced asymmetry described above, a symmetric, uniform fin doping may be desired. Accordingly, in some embodiments, the tilted ions implantation of common dopants may be conducted at several twist angles to make implanted doping profile more symmetric. A commonly known implantation technique, known as the dual implant, uses two twist angles which are 180 degrees apart for this purpose. The energy of implanted dopant ions can be selected to be low enough to prevent a full amorphization of fins and may be between 300 eV and 4 keV. In order to further suppress full amorphization of fins, the implantation of dopants may be conducted at an elevated substrate temperature of from 50 C to about 500 C. While the dopant implantation step may be conducted as part of block 250, it may be also moved after the insulator etching block 260 because it produces a symmetric damage profile within the insulator that may negate the asymmetric damage profile formed in block 250.

After the etching step and the optional dopant implantation step, stressors (epitaxially-grown fin caps), may be grown, as indicated in block 270. Stressors may be made of mixtures of elements including, but not limited to silicon, germanium, carbon and their common dopants: boron, phosphorus, and arsenic, simultaneously deposited on a finFET fin using methods of selective epitaxial growth. For purposes of this discussion, chemical vapor deposition (CVD) process and reactor will be used as a representative epitaxial growth process and apparatus, although other methods and reactors may also be used to grow epitaxial stressors. In a CVD process, the elements are delivered to a heated substrate in the form of gaseous precursors. Silane, disilane, or trichlorsilane may be use as silicon precursors. Germane may be used a germanium precursor. Methane can be use as a carbon precursor. Borane, diborane, arsine, and phosphine may be used as dopant precursors. The respective precursors may then be adsorbed onto a substrate surface. The adsorbed molecules may then diffuse along the substrate surface and chemically incorporate into the substrate material or desorb back into the gaseous environment of the CVD reactor. Substrate temperature controls the rates of adsorption, surface diffusion, chemical incorporation/bonding, and desorption. A CVD epitaxial process typically exhibits a high surface mobility of adsorbed molecules on crystalline surfaces allowing for an atom-by-atom, layer-by-layer growth on such surfaces. Some types of epitaxial growth may occur selectively on some surfaces (such as finFET fin materials, i.e. silicon or silicon-germanium) but not on others (such as dielectric materials). The rates of growth may vary according to the nature of the surface on which growth occurs. The difference in growth rates on different surfaces may be further amplified by adding gaseous etchant that would speed up desorption of weakly bonded molecules. Vapors of hydrochloric acid, HCl, may be used for this purpose. Substrate temperature may also be adjusted to change respective rates. Selective epitaxial growth may occur when the rate of desorption exceeds the rate of chemical incorporation/bonding on dielectric surfaces but the rate of adsorption and chemical incorporation/bonding exceeds the rate of desorption for crystalline surfaces. For selective epitaxial growth, the crystalline surfaces must be free of their native dielectrics at the onset of growth. In-situ chemical pre-clean and thermal desorption pre-bake may be used for this purpose.

Epitaxial growth of stressor material may proceed differently on substrates that have different geometrical shapes and different crystallographic orientations of exposed semiconductor surfaces. When the dielectric material is leveled with the edge of finFET sidewall surface and the fin sidewall surface has (100) orientation, the epitaxial growth can proceed outward of the fin sidewall with the respective top and bottom edges of grown material being intersecting (111) crystallographic planes. As the growth proceeds, the two intersecting (111) edges form a vertex. At this point, the epitaxial outward growth slows since all exposed semiconductor surfaces become (111) oriented. If the fin top crystalline surface is exposed during the growth, the epitaxial growth proceeds both outward and upward resulting in a higher position of the vertex (further away from the wafer surface).

In embodiments where the dielectric surface is asymmetrically recessed with respect to the fin left and right fin sides, the stressor formation may proceed differently for the different fin sides. The left side of the fin where the dielectric material is not recessed will proceed in a manner similar to the one described above. The right side of the fin where the dielectric material is recessed will start growing outward but the top and bottom edges will be two parallel (111) planes. As the growth proceeds, the bottom (111) plane on the right side may collide with the recessed dielectric surface and can no longer support growing (100) front. At this point, the bottom edge of the growing right (100) surface may become a different (111) plane that is not constricted by the dielectric surface. As the growth proceeds further, the two intersecting (111) edges on the right side form the right vertex, however, the position of the right vertex will be substantially lower than that of the left vertex. It is further noted that the difference in position between left and right vertices is significantly larger than the amount of dielectric surface recess on the right side.

In a first stage of asymmetric stressor growth, the stressor may grow outward from the sides of the finFET fin but not reach out far enough to touch each other. In a second stage of asymmetric stressor growth, the sides of adjacent stressors may grow toward each other and touch each other, or they may grow past each other such that the side of one stressor is beneath the side of the adjacent stressor as shown in FIG. 1. In some embodiments where stressors grow past each other, the top of one stressor may touch the bottom of the other stressor. In other embodiments, the top stressor and the bottom stressor may grow past each other without touching at all. Whether or not the top and bottom stressors touch each other, the top stressor may overhang the bottom stressor and the amount of overlap (the distance that the vertex of the top stressor has grown past the vertex of the bottom stressor, 170, as shown in FIG. 1) may be measured by taking a cross section of the finFET after the stressor growth ends. In a third stage, the adjacent stressors may grow into each other, resulting in a near-continuous film of stressor material atop the fins, according to aspects of the present disclosure. The tendency of a stressor to grow above another under asymmetric conditions may depend on details such as the fin pitch, the fin height, and the particular elements (and the proportion of the elements) used to form stressors on fins.

During integrated circuit manufacturing, plasma etching to form contacts to the source and drain regions may sometimes etch through the stressor materials to expose and damage the insulator film beneath the finFET. Embodiments of FinFETs with overlapping stressors may provide greater protection for the underlying insulator film than may be found in finFET structures where the stressors merely touch each other, or where they do not touch at all. This greater protection of the underlying insulator film may be due to the greater thickness of stressor material above the insulator film in embodiments with overlapping, asymmetric stressors than may be found in symmetric stressors that have been grown large enough to touch each other.

Other embodiments of finFETs with overlapping stressors may provide manufacturers with additional ability to regulate the strain applied to finFET fins by materials that overlay the stressors. While the stressor may apply some strain on the finFET fin, in some embodiments, a second layer of material may be deposited on top of the stressors to impose further strain on the fins. The second layer of material may induce strain in the stressors, modifying the amount of strain imposed on the fin by the stressors. In embodiments of finFETs with asymmetric stressors, the greater thickness of asymmetric stressors may increase the amount of strain that the fins receive from the stressors and may reduce the amount of strain that the fins receive from the second layers. In other embodiments, various combinations of thicknesses of stressors and second layers that rest on the stressors may be used to "tune" the strain applied to either NFET or PFET devices. PFET devices may receive thicker stressors than NFET devices because they have greater sensitivity to strain induced by the stressors on finFET fins.

Some embodiments of finFETs may receive strain applied perpendicular or parallel to the direction of current flow within the channel in the fin. In particular embodiments of the present disclosure, however, the uneven growth of a stressor on a fin may apply shear and shear torsional strain. Shear and shear torsional strain may be applied to a fin because the asymmetric stressor is larger on one side of the fin than on the other side. Shear and shear torsional strain may arise from the formation of stressors on a fin, where the stressors on opposite sides of the fin are asymmetric in opposite directions. For example, in embodiments of finFETs with shear and shear torsional strain, a stressor on a source side of a finFET fin may grow preferentially toward the left, while a stressor on the drain side of a finFET may grow preferentially toward the right, according to the manner in which the finFET is masked during stressor growth. As described herein, the asymmetry (preferential growth) of a stressor may be directed by the direction and depth of ion implantation into the insulator film prior to stressor growth.

Following stressor growth, the method may include a determination as to whether all the finFETs have received stressors, as shown in block 280. As described herein, stressors may be grown at different times on nFETS and pFETS. Stressors may also be grown at different times on opposite sides (source side versus drain side) of fins, according to whether a manufacturer wishes to apply shear and shear torsional strain to a fin, according to embodiments. The determination may include assessment of whether all nFETs, all pFETs, all source-sides of fins, and all drain-sides of fins have been processed to receive epitaxially grown stressors. If stressor formation is not complete, the method may return back to block 240 and a new set of finFETs (and sides of fins) may be selected for another round of stressor formation according to blocks 240, 250, 260, and 270. The method may also include a step in which a replacement metal gate is formed, as described in block 290, after which electrical contacts are created in contact with the finFET, as described in block 295. The method ends in block 299.

Figure 3:
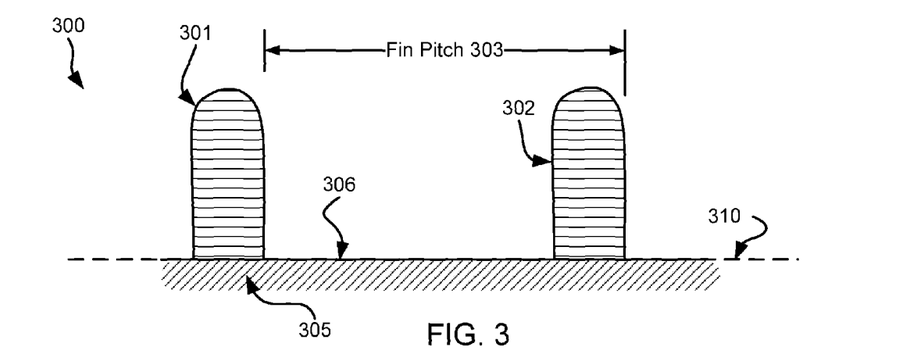
FIG. 3 shows an embodiment of a finFET structure on a layer of insulating material according to aspects of the present disclosure.

FIG. 3 shows an embodiment of a finFET structure 300 on a layer of insulating material 305 at an intermediate stage of manufacture, according to aspects of the present disclosure. FinFET fin 301 may be separated from fin 302 by a fin pitch 303, measured from one position (such as the right side) on fin 301 to a corresponding position (the right side) on fin 302. Fins 301 and 302 may rise vertically from the top side 306 of an insulator film 305. The top side 306 may have a horizontal plane between the bottom of the first fin 301 and the insulator film 305 and the bottom of the second fin 302 and the insulator film. In particular embodiments described hereafter, the horizontal plane may be used to describe ion implantation and recessing insulator films.

Figure 4:
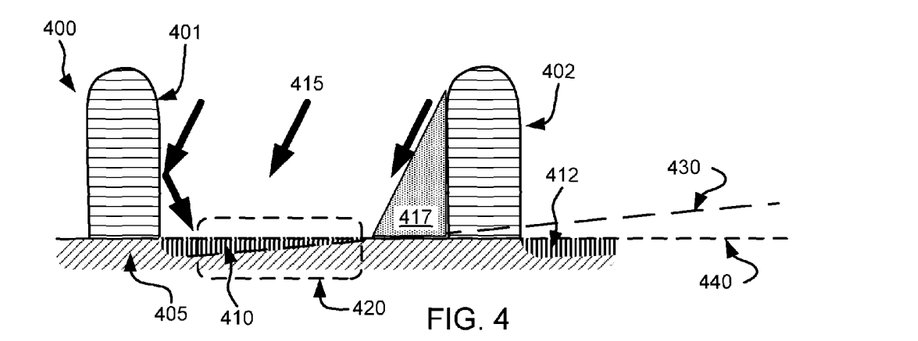
FIG. 4 shows an embodiment of a finFET structure on a layer of insulating material that has been implanted with ions, according to aspects of the present disclosure.

FIG. 4 shows an embodiment of a finFET structure 400 on an insulator film 405 that has been implanted with ions, according to aspects of the present disclosure. In this embodiment, the insulator film 405 has been implanted with ions to form implanted regions 410 and 412. When ions may be implanted after travelling in an implanting direction 415 (at an implantation angle that is not perpendicular to the insulator film 405 surface), the ions may strike the right sides of fins 401 and 402. As a result, the ions may tend to implant more deeply on left sides of the regions next to the fins' right sides as can be seen in implanted regions 410 and 412. In some embodiments a fin may create an implantation shadow 417 that can reduce or block ion implantation near the shadowed side of the fin. Some embodiments, especially those with tall fins or fins that are far close together, may be creates using implantation angles of between three degrees and 30 degrees from a line perpendicular to the insulator film surface. Embodiments that may have short finFET fins or finFETs where the fins are relatively far apart may undergo implantation using incident implantation angles of between ten and sixty degrees from vertical/perpendicular to the surface of the insulator film 405.

A graded implantation profile 420 may exist in a median region of the intra-fin insulator film, possibly indicating that the implantation shadow and ion reflection from one of the fins have induced a distribution of implantation depths in the insulator film between the fins. In some embodiments, this graded implantation profile 420 may be roughly linear for most of the implanted region, while in other embodiments, there may be an irregular shape to the interface between implanted and unmodified insulator film.

In the embodiment shown, the left side of fin 402 is the shadowed side. Accordingly, the implantation may be less deep or less dense on the shadowed side of the region than on the more-exposed side of the implanted region 410 and may not happen at all in the shadowed side. Ion implantation density may be deeper or denser on the right side of the implanted region 410 in some embodiments if the incident ions may strike a fin and reflect from the fin into the insulator film, as shown on the right side of fin 401.

The interfaces between insulator film 405 and the fins 401 and 402 may have a first slope 440. In some embodiments, after implantation, the top surface of the insulator film 405 may be little changed (in height) from its pre-implantation level. The depth of the implantation may be different at one side of the region relative to the other side of the region, adjacent to the other finFET fin. An angled implantation trajectory may put part of the implanted region 410 in the shadow of a finFET fin. This shadow may reduce or block implantation in this part of the implanted region. The middle of the implanted region 410 may be fully exposed to the ion source, while the region adjacent to the other finFET fin may receive ion implantation both directly from the ion source as well as ions that reflect off of the side of the finFET closest to that part of the region. The bottom of the implanted region may have a second slope 430 relative to the first slope 440 along the top surface of the insulator film 405. According to embodiments, the shape of the bottom of the implanted region may roughly match the slope of an asymmetrically recessed area exposed after etching an implanted region of an insulator film, such as the recessed region 135 shown in FIG. 1.

Figure 5:
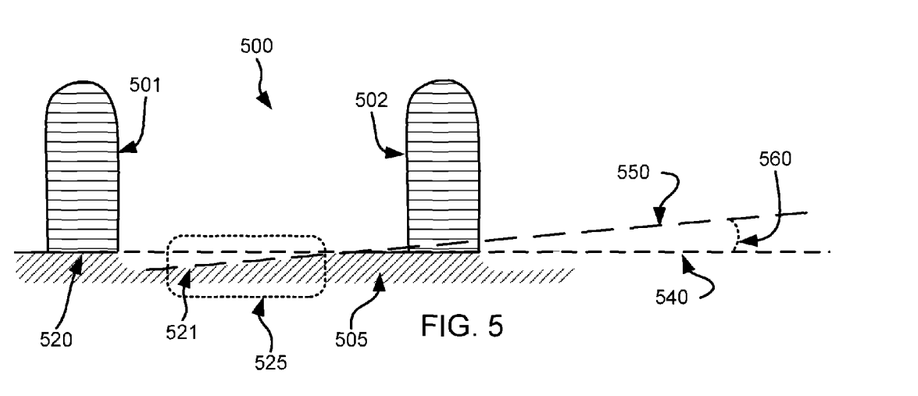
FIG. 5 shows an embodiment of a finFET structure on a layer of insulating material after etching to remove at least the implanted insulating material, according to aspects of the present disclosure.

FIG. 5 shows an embodiment of a finFET structure 500 on an insulating film 505 after etching to remove at least ion-implanted insulating material, according to aspects of the present disclosure. As described in FIG. 2, a finFET and the underlying insulator film 505 may be etched with plasma or chemically etched (such as with dilute acid mixtures) in order to clean the wafer surface and to remove portions of the insulator film 505. For purposes of this discussion, chemical etching with dilute aqueous acid mixtures will be used, although methods of plasma etching may also be used in different manufacturing scenarios.

Exposure of the insulator film 505 to a dilute acidic etching solution may result in the removal of some of the insulator film as chemical reactions between the acid and the insulator film occur. For example, dilute acids such as hydrofluoric acid can react with silicon dioxide to remove a portion of the silicon dioxide surface exposed to the dilute acids. When an insulator film is smooth and not damaged, the film removal rate may be lower than in the case of an insulator film that has been damaged because of surface bombardment or ion implantation, as described for FIG. 2. Insulator with weakened and distorted chemical bonding caused by ion bombardment may lead to greater etch rates as compared to removal rates for a smooth, undisturbed insulator. An insulator film with embedded chemically active ions may etch more or less quickly where ion density in the film is elevated, because the chemically active ions may promote or retard chemical etching of the film.

In some embodiments the removal may be uneven (or asymmetric) across the exposed region of the insulator film between finFET fins. One side of the recessed region 521, next to fin 501, may be deeply etched, while the side next to fin 502 may be recessed to a more shallow depth because implantation may be more shallow or absent, consistent with being in an implantation shadow cast by fin 502. Accordingly, the recessed region between fins 501 and 502 may have a graded recess profile 525 with a slope 550 that is offset from the slope 540 corresponding with original surface of the insulator film. In some embodiments, the graded recess profile 525 may change at a constant rate across the recessed region, while in other embodiments, there may be some curvature or undulation of the recessed surface. The angle 560 between the two slopes, 550 (corresponding to the bottom of the recessed region 521) and 540 (which may be determined by looking at the interface 520 between the insulating film and the bottom of fins 501 and 502) may be as low as half a degree, or may be as great as twenty degrees. Embodiments of finFETs with recessed regions similar to region 521 with graded recess profiles 525 may be suitable for growing asymmetric stressors on fins, as described herein.

Figure 6:
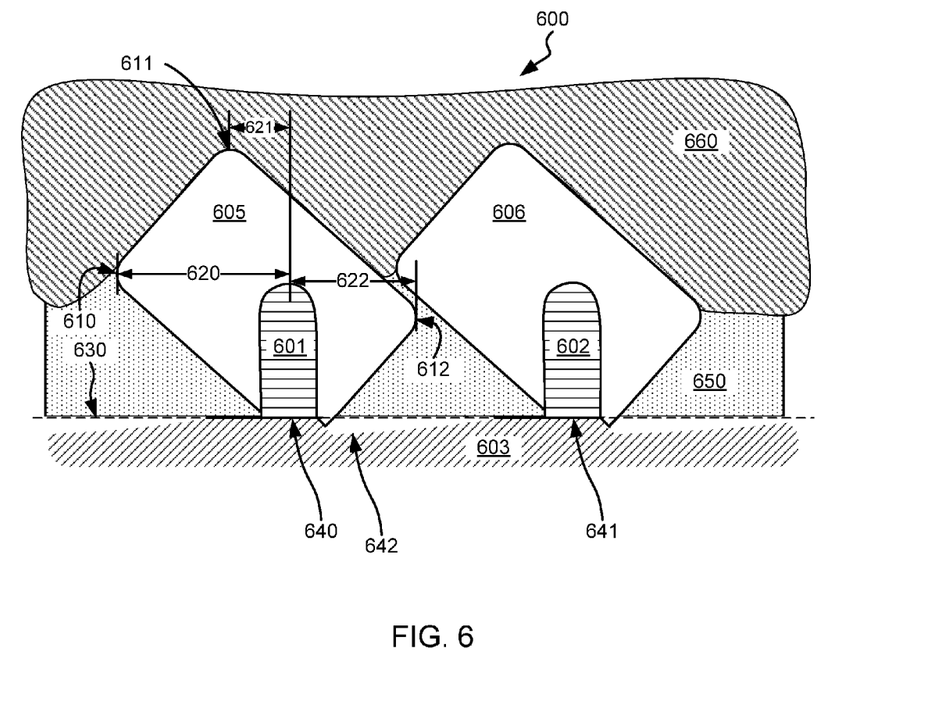
FIG. 6 shows an embodiment of a finFET structure covered by epitaxially grown fin cap layers, according to aspects of the present disclosure.

FIG. 6 shows an embodiment of a finFET structure 600 covered by stressors and a strain-inducing layer, according to aspects of the present disclosure. Two finFET fins, 601 and 602, may stand on an insulating film 603, where the first fin 601 and the second fin 602 meet the insulating film at a pair of interfaces: 640 and 641, respectively. A line 630 through the interfaces may have a slope that can be used to describe the degree of asymmetry in the recessed region 642 between the fins. The recessed region 642 may be deeper (relative to the to the interface line 630) next to fin 601 than next to the other fin 602 because of deeper ion implantation in that part of the insulating film in a prior step of the manufacturing process.

As part of the manufacturing process, stressors 605 and 606 may be grown on the fins 601 and 602, respectively, using methodologies such as chemical vapor deposition (CVD), according to aspects of the disclosure. Because of the asymmetric recess of the region 642, the stressors formed on the fins may experience preferential growth on one side (and the top) of the fin, as described herein. Stressor 605 may have a left vertex 610, a right vertex 612, and a top vertex 611 after the CVD process has begun. According to embodiments, slower stressor growth may occur on the side of fin 601 above the deeper recess, than occurs on the left side of fin 601 (or fin 602), above the shallow recess, promoting a "lopsided" or "asymmetric" shaped stressor 605. Accordingly, the thickness 620 of the left side of stressor 605 may be much bigger than the thickness 622 of the right side of stressor 605, measured from the fin center. Thicknesses may be measured from the center or from the sides of the fin closest to their respective vertices. In some embodiments, the top vertex may be offset by an offset distance 621 sufficiently large that the top vertex 611 is not directly above the fin 601, but directly above the insulator film 603 instead.

A strain-inducing layer 660 may be deposited on top of the stressors and on top of the finFET gate 650. The strain-inducing layer 660 may be made of a metal silicide such as titanium silicide, or some other material that can induce strain in a stressor. Stressors may have a crystal structure with atomic spacing that can induce strain in finFET fins. Strain-inducing layer 660 may have a different crystal structure with a different atomic spacing that can impose strain on the stressors that may modify the amount of strain that they may, in turn, impose on finFET fins.

Figure 7:
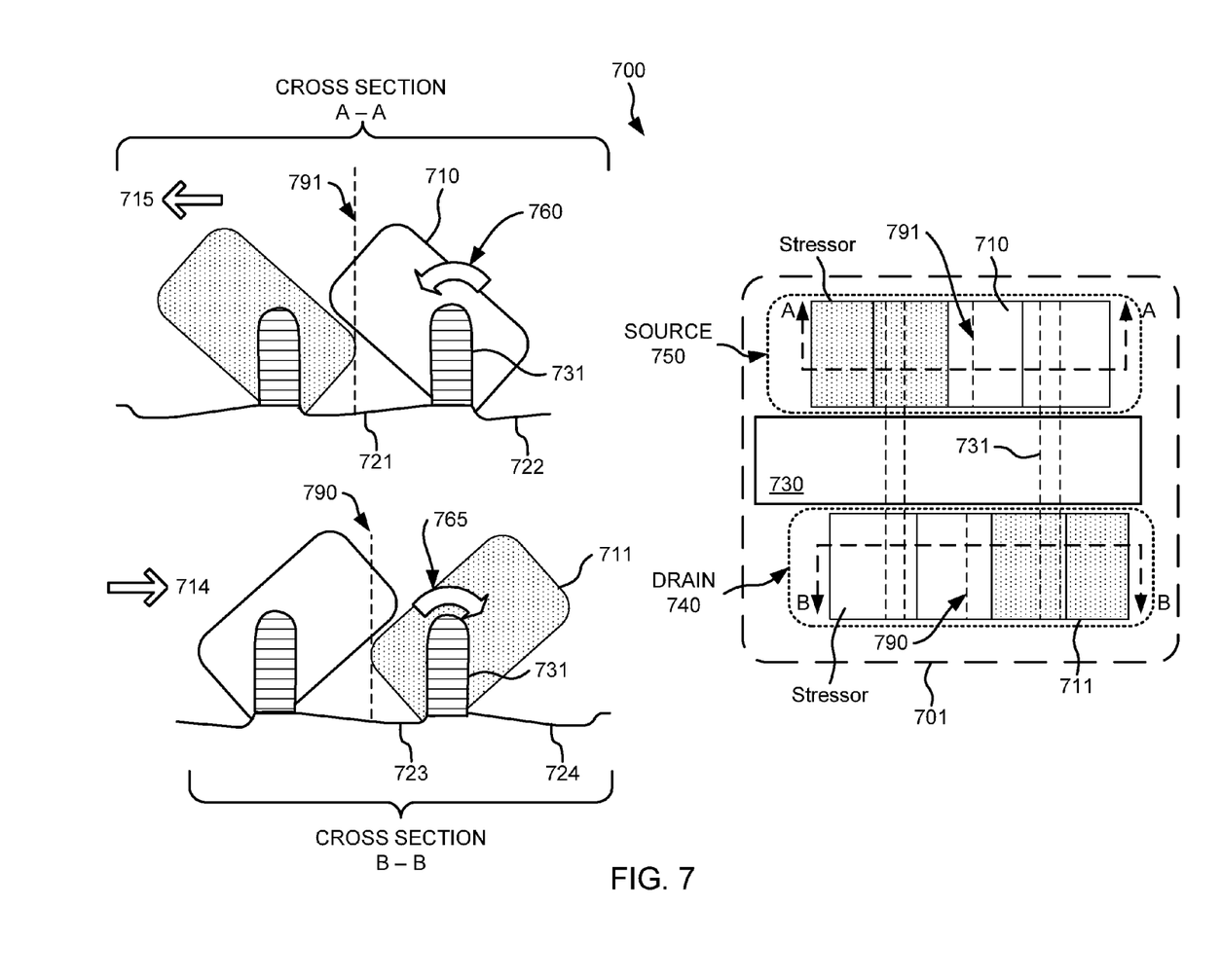
FIG. 7 shows a view and cross sections of a finFET structure in which strain may be induced according to aspects of the present disclosure.

FIG. 7 shows a view and cross section of a finFET structure 700 in which strain may be induced in finFET fins according to aspects of the present disclosure. A finFET 701 may have a source 750 and a drain 740 and a plurality of fins that extend from the source 750 to the drain 740 beneath a gate 730. A fin 731 in the finFET 701 may have a source-side stressor 710 and a drain-side stressor 711. According to embodiments, the fin 731 may stand on an insulating film made of, e.g., silicon dioxide. Fin 731 may have two recessed regions 721 and 722 on either side of it on the source side of the fin, and two more recessed regions 723 and 724 on either side of it on the drain side of the fin.

Cross-section A-A shows the source side of fin 731 and the recessed regions 721 and 722. Fin 731 is covered by a stressor 710 tilted in a first direction 715 (to the left) and recessed regions 721 and 722 are asymmetrically recessed, being deeper at their left sides than at their right sides. Line 791 is a vertical projection of the position of a vertex of one finFET when that vertex is beneath another finFET. Cross section B-B shows the drain side of fin 731 and the recessed regions 723 and 724. Fin 731 is covered by a stressor 711 tilted in a second direction 714 (to the right) and recessed regions 723 and 724 are asymmetrically recessed, being deeper at their right sides than at their left sides. As with cross section A-A, line 790 is a vertical projection of the position of a vertex of one finFET when that vertex is located below another finFET. The top down view shows the positions of line 790 and line 791 beneath their respective top finFETs.

Stressors may induce strain in a finFET fin because the atomic spacing of the fin material in the channel (the region beneath the gate, typically silicon) may not match the atomic spacing of the material the stressor is made of. Applying more of a stressor material to a fin may increase the amount of strain that the stressor induces in the fin.

Accordingly, having a small thickness of stressor on one side of a fin, and a large thickness of stressor on the other side of the fin (and on the top of the fin), may apply a force perpendicular to the fin. This force may also apply a twisting moment because the force is centered away from the fin center and toward the fin top. This may create shear and shear torsional strain in the fin. Directional arrow 760 may indicate the direction in which a first force is applied to the fin 731 on the source-side of the fin, while directional arrow 765 may indicate the direction in which a second force is applied to fin 731 on the drain side of the fin. Because the first force and the second force are in opposite directions, and may be applied on the source and drain sides of the fin 731, respectively, the fin may experience bending. These bending forces may be centered away from the fin center and toward its top creating bending moments twisting fin sides in opposite directions. The bending forces can create shear strain in the fin beneath the gate and the opposing twisting moments can create shear torsion strain in the fin beneath the gate.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A device comprising:
   a fin field effect transistor (finFET) that includes:
      an insulating film on a horizontal surface of a semiconductor substrate, the insulating film having a top side with a first slope that is substantially parallel to the horizontal surface;
      a first fin that extends vertically from the insulating film, the first fin having a reference line that extends vertically from the top side and that bisects the first fin; and
      an epitaxial cap on the fin and made of a first material and having:
         a left vertex on a left side of the epitaxial cap and at a first horizontal distance from the reference line;
         a right vertex on a right side of the epitaxial cap and at a second horizontal distance from the first reference line, wherein the first horizontal distance is at least twenty percent greater than the second horizontal distance; and
         a top vertex that is at a third horizontal distance to the left of the reference line, wherein a recessed region of the insulating film has a graded recess profile below the first slope.

2. The device of claim 1, further comprising a strain-inducing layer made of a second material and positioned on top of the epitaxial cap to strain the first fin.

3. The device of claim 2, wherein the second material is selected from the group consisting of a metal silicide, a silicon carbon alloy, and doped silicon.

4. The device of claim 1, wherein the first horizontal distance plus the second horizontal distance are greater than a fin pitch for the finFET.

5. The device of claim 1, wherein the graded recess profile is deeper near the first fin than near a second fin, having a second slope no less than 0.5 degrees and no more than ten degrees.

6. The device of claim 5, wherein the second slope is no less than 1 degree and no more than 5 degrees.

7. The device of claim 1, wherein the first material includes at least one element selected from the group consisting of silicon, germanium, carbon, boron, phosphorus, and arsenic.

8. The device of claim 1, wherein the epitaxial cap induces a shear strain in the fin.

9. The device of claim 1, wherein the epitaxial cap induces a torsional shear strain in the fin.

* * * * *